US011108357B2

(12) United States Patent
Nomiya et al.

(10) Patent No.: US 11,108,357 B2
(45) Date of Patent: Aug. 31, 2021

(54) CIRCUIT DEVICE, OSCILLATOR, ELECTRONIC APPARATUS, AND VEHICLE

(71) Applicant: Seiko Epson Corporation, Tokyo (JP)

(72) Inventors: Takashi Nomiya, Matsumoto (JP); Naoki Ii, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/906,098

(22) Filed: Jun. 19, 2020

(65) Prior Publication Data

US 2020/0403571 A1 Dec. 24, 2020

(30) Foreign Application Priority Data

Jun. 21, 2019 (JP) .............................. JP2019-115187

(51) Int. Cl.
*H03B 5/04* (2006.01)
*H03H 7/06* (2006.01)
*H03B 5/36* (2006.01)

(52) U.S. Cl.
CPC .................. *H03B 5/04* (2013.01); *H03B 5/36* (2013.01); *H03H 7/06* (2013.01)

(58) Field of Classification Search
CPC ........................................................ H03B 5/04
USPC .................................................. 331/66, 176
See application file for complete search history.

(56) References Cited

U.S. PATENT DOCUMENTS

| 2010/0171559 A1* | 7/2010 | Chou | ........................ | H03B 5/24 |
| | | | | 331/66 |
| 2014/0009235 A1* | 1/2014 | Yoshimura | ................ | H03L 1/04 |
| | | | | 331/66 |

FOREIGN PATENT DOCUMENTS

| JP | 2000-261248 A | 9/2000 |
| JP | 2002-280833 A | 9/2002 |
| JP | 2003-163577 A | 6/2003 |

* cited by examiner

*Primary Examiner* — Joseph Chang
(74) *Attorney, Agent, or Firm* — Harness, Dickey & Pierce, P.L.C.

(57) ABSTRACT

The circuit device includes a current generation circuit configured to generate a temperature compensation current based on a temperature detection voltage, and a current-voltage conversion circuit configured to perform current-voltage conversion on the temperature compensation current to output a temperature compensation voltage. The current-voltage conversion circuit includes an operational amplifier, and a feedback circuit. The operational amplifier includes a differential section having a current mirror circuit and differential pair transistors, an output section configured to output the temperature compensation voltage, and an RC low-pass filter configured to output a signal obtained by performing a low-pass filter process on an output signal of the differential section to an input node of the output section.

12 Claims, 12 Drawing Sheets

US 11,108,357 B2

CIRCUIT DEVICE, OSCILLATOR, ELECTRONIC APPARATUS, AND VEHICLE

The present application is based on, and claims priority from JP Application Serial Number 2019-115187, filed Jun. 21, 2019, the disclosure of which is hereby incorporated by reference herein in its entirety.

BACKGROUND

1. Technical Field

The present disclosure relates to a circuit device, an oscillator, an electronic apparatus, a vehicle, and so on.

2. Related Art

In JP-A2002-280833, there is disclosed a method of reducing noises using an RC low-pass filter in a circuit device for outputting a control voltage for controlling a frequency of an oscillation circuit based on output of a temperature detection circuit.

In a resistor included in the RC low-pass filter, there occurs a thermal noise. In order to suppress the thermal noise, it is desirable to decrease the resistance value of the resistor. On the other hand, in order to enhance an effect of reducing the noise component, it is necessary to lower the cutoff frequency of the RC low-pass filter. As a result, the size of a capacitor included in the RC low-pass filter increases, and reduction in size of the equipment such as an oscillator including the circuit device is difficult.

SUMMARY

An aspect of the present disclosure relates to a circuit device including a current generation circuit configured to generate a temperature compensation current based on a temperature detection voltage, and a current-voltage conversion circuit configured to perform current-voltage conversion on the temperature compensation current to output a temperature compensation voltage, wherein the current-voltage conversion circuit includes an operational amplifier having a first input node to which the temperature compensation current is input, and an output node configured to output the temperature compensation voltage, and a feedback circuit disposed between the first input node and the output node of the operational amplifier, and the operational amplifier includes a differential section having a current mirror circuit and differential pair transistors, an output section configured to output the temperature compensation voltage, and an RC low-pass filter configured to output a signal obtained by performing a low-pass filter process on an output signal of the differential section to an input node of the output section.

DESCRIPTION OF AN EXEMPLARY EMBODIMENT

The embodiment will hereinafter be described. It should be noted that the embodiment described below do not unreasonably limit the contents set forth in the appended claims. Further, all of the constituents described in the embodiment are not necessarily essential elements.

1. Circuit Device

A temperature compensation voltage VCOMP based on a temperature detection voltage VTS will hereinafter be described taking when used for the temperature compensation in an oscillator 4 as an example. In other words, a configuration in which the temperature compensation voltage VCOMP is output to an oscillation circuit 30 for oscillating a resonator 10. It should be noted that the application target of a circuit device 20 according to the present disclosure is not limited to the configuration described above. In other words, the circuit using the temperature compensation voltage VCOMP is not limited to the oscillation circuit 30, and can be expanded to other circuits which require the temperature compensation.

Figure 1:
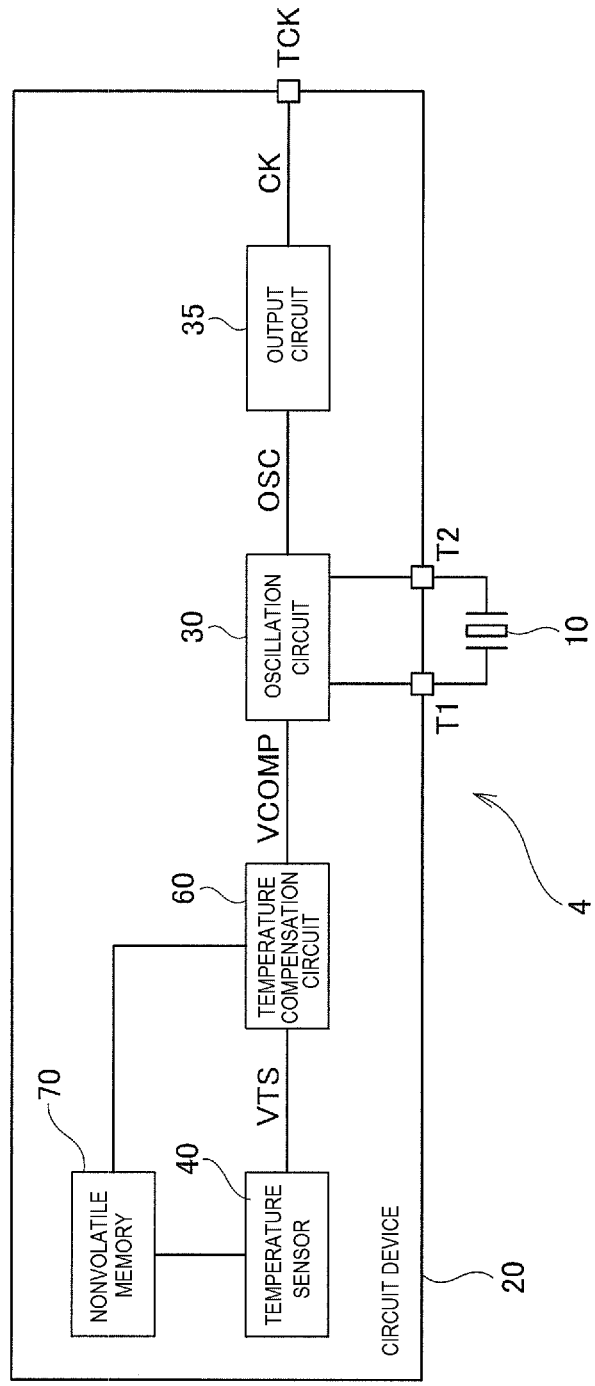
FIG. 1 is a diagram showing a configuration example of a circuit device.

FIG. 1 shows a configuration example of the circuit device 20 and the oscillator 4 including the circuit device 20. The oscillator 4 includes the resonator 10 and the circuit device 20. The resonator 10 is electrically coupled to the circuit device 20. The resonator 10 and the circuit device 20 are electrically coupled to each other using, for example, internal interconnections of a package for housing the resonator 10 and the circuit device 20, bonding wires, or metal bumps. It should be noted that the configuration of the circuit device 20 is not limited to the configuration shown in FIG. 1, but it is possible to adopt a variety of modified implementations such as elimination of some of the constituents or addition of other constituents. For example, it is possible for the circuit device 20 according to the present embodiment to have a configuration corresponding to a temperature compensation circuit 60, and the oscillation circuit 30, an output circuit 35, a temperature sensor 40, a nonvolatile memory 70, and so on can be omitted.

The resonator 10 is an element for generating a mechanical vibration due to an electrical signal. The vibrator 10 can be realized by a resonator element such as a quartz crystal resonator element. The resonator 10 can be realized by, for example, a quartz crystal resonator element vibrating in a thickness-shear mode having the cutting angle of AT-cut or SC-cut. For example, the resonator 10 can be a resonator as an SPXO (Simple Packaged Crystal Oscillator). Alternatively, the resonator 10 can be a resonator incorporated in an oven-controlled oscillator (OCXO) equipped with a constant-temperature oven, or can also be a resonator incorporated in a temperature-compensated crystal oscillator (TCXO) not provided with the constant-temperature oven. It should be noted that the resonator 10 according to the present embodiment can be realized by a variety of resonator elements such as a resonator element other than the thickness-shear vibration type or a piezoelectric resonator element formed of a material other than the quartz crystal. For example, as the resonator 10, it is also possible to adopt a surface acoustic wave (SAW) resonator, an MEMS (micro electro-mechanical systems) resonator as a silicon resonator formed using a silicon substrate, and so on.

The circuit device 20 is an integrated circuit device called an IC (Integrated Circuit). For example, the circuit device 20 is an IC manufactured using a semiconductor process, and a semiconductor chip having circuit elements formed on a semiconductor substrate. The circuit device 20 includes the oscillation circuit 30, the output circuit 35, the temperature sensor 40, the temperature compensation circuit 60, the nonvolatile memory 70, and terminals T1, T2, and TCK.

The terminals T1, T2, and TCK are, for example, pads of the circuit device 20. The terminals T1 is electrically coupled to one end of the resonator 10, and the terminal T2 is electrically coupled to the other end of the resonator 10. The resonator 10 and each of the terminals T1, T2 are electrically coupled to each other using, for example, the internal interconnection of the package for housing the resonator 10 and the circuit device 20, the bonding wire, or the metal bump. The terminal TCK is a terminal from which a clock signal CK generated by the circuit device 20 is output. The terminal TCK is electrically coupled to an external terminal for external coupling of the oscillator 4. The terminal TCK and the external terminal are electrically coupled to each other using, for example, the internal interconnection of the package, the bonding wire, or the metal bump. Further, the external terminal of the oscillator 4 is electrically coupled to an external device.

The temperature sensor 40 is a sensor for detecting the temperature. Specifically, the temperature sensor 40 uses the temperature dependency provided to the forward voltage of a PN junction to thereby output the temperature detection voltage VTS having a voltage value changing dependently on the temperature. Further, the temperature sensor 40 performs offset correction of the temperature detection voltage VTS based on zero-order correction data stored in the nonvolatile memory 70. In other words, the temperature sensor 40 adjusts the offset of the temperature detection voltage VTS as much as the offset represented by the zero-order correction data. It should be noted that the offset correction of the temperature detection voltage VTS corresponds to zero-order correction in the temperature compensation of the oscillation frequency.

The temperature compensation circuit 60 outputs the temperature compensation voltage VCOMP based on the temperature detection voltage VTS to thereby perform the temperature compensation of the oscillation frequency of the oscillator 30. The temperature compensation voltage VCOMP is a voltage for canceling or reducing the temperature characteristic of the oscillation frequency. The temperature compensation circuit 60 outputs the temperature compensation voltage VCOMP with polynomial approximation using the temperature as a parameter. When the temperature detection voltage VTS is approximated with, for example, a fifth-degree polynomial, a zero-order coefficient, a first-order coefficient, a second-order coefficient, a third-order coefficient, a fourth-order coefficient, and a fifth-order coefficient are stored in the nonvolatile memory 70 as a zero-order correction datum, a first-order correction datum, a second-order correction datum, a third-order correction datum, a fourth-order correction datum, and a fifth-order correction datum, respectively. The temperature compensation circuit 60 performs the temperature compensation based on the first-order correction datum, the second-order correction datum, the third-order correction datum, the fourth-order correction datum, and the fifth-order correction datum. It should be noted that the zero-order correction is performed by the temperature sensor 40 as described above. It should be noted that the polynomial approximation is not limited to the fifth-degree polynomial approximation.

The nonvolatile memory 70 stores the temperature compensation data used for the temperature compensation of the oscillation frequency. The temperature compensation data comprise the zero-order correction datum, the first-order correction datum, the second-order correction datum, the third-order correction datum, the fourth-order correction datum, and the fifth-order correction datum. For example, when manufacturing the oscillator 4, a test instrument measures the temperature characteristic of the oscillation frequency based on the clock signal CK output by the oscillator 4. The test instrument performs the polynomial approximation of the temperature characteristic thus measured to obtain the coefficients of the respective terms, and then writes the coefficients into the nonvolatile memory 70 as the temperature compensation data.

The nonvolatile memory 70 is, for example, an EEPROM (Electrically Erasable Programmable Read Only Memory) or a flash memory. The EEPROM can be realized by, for example, floating-gate memory cells. The flash memory can be realized by, for example, MONOS (Metal Oxide Nitride Oxide Silicon) memory cells. Alternatively, the nonvolatile memory 70 can also be a memory using fuse cells. In the memory of this type, the fuse cell as the memory cell includes a resistor and a selector element coupled in series to the resistor. The selector element is, for example, a PN-junction diode or a MOS transistor. For example, one end of the resistor is coupled to a bit line, and the other end of the resistor is coupled to an anode of the diode. A cathode of the diode is coupled to a word line. The resistor functioning as the fuse element is a programmable resistor having a variable resistance value. Due to the variable resistance value, a datum is stored in the fuse cell.

The oscillation circuit 30 is a circuit for oscillating the resonator 10. For example, the oscillation circuit 30 is electrically coupled to the terminal T1 and the terminal T2, and oscillates the resonator 10. As the oscillation circuit 30, there can be used a variety of types of oscillation circuit such as a Pierce type, a Colpitts type, an inverter type, and a Hartley type. The oscillation circuit 30 cancels or reduces the temperature characteristic of the oscillation frequency based on the temperature compensation voltage VCOMP. For example, the oscillation circuit 30 includes a variable capacitance capacitor CCOMP the capacitance of which is variably controlled by a potential difference between the both ends. One end of the variable capacitance capacitor CCOMP is electrically coupled to one of the terminal T1 and the terminal T2, and the temperature compensation voltage VCOMP is input to the other end of the variable capacitance capacitor CCOMP. The oscillation circuit 30 outputs an oscillation signal OSC.

The output circuit 35 is electrically coupled to the oscillation circuit 30 via the interconnections. Further, the output circuit 35 outputs the clock signal CK by buffering the oscillation signal OSC from the oscillation circuit 30. In this case, it is possible for the output circuit 35 to output the clock signal CK to the outside in a variety of signal formats. For example, the output circuit 35 outputs the clock signal CK in the signal format such as LVDS (Low Voltage Differential Signaling), PECL (Positive Emitter Coupled Logic), HCSL (High Speed Current Steering Logic), or differential CMOS (Complementary MOS). For example, the output circuit 35 can also be a circuit capable of outputting the clock signal CK at least two signal formats of LVDS, PECL, HCSL, and differential CMOS. It should be noted that the signal format of the clock signal CK output by the output circuit 35 is not limited to the differential signal format, but can also be a non-differential format such as single-end CMOS or clipped sine wave.

It should be noted that the coupling in the present embodiment is electrical coupling. The electrical coupling means coupling capable of transmitting an electrical signal, and is coupling with which transmission of information by the electrical signal is achievable. The electrical coupling can also be coupling via an active element or the like.

Figure 2:
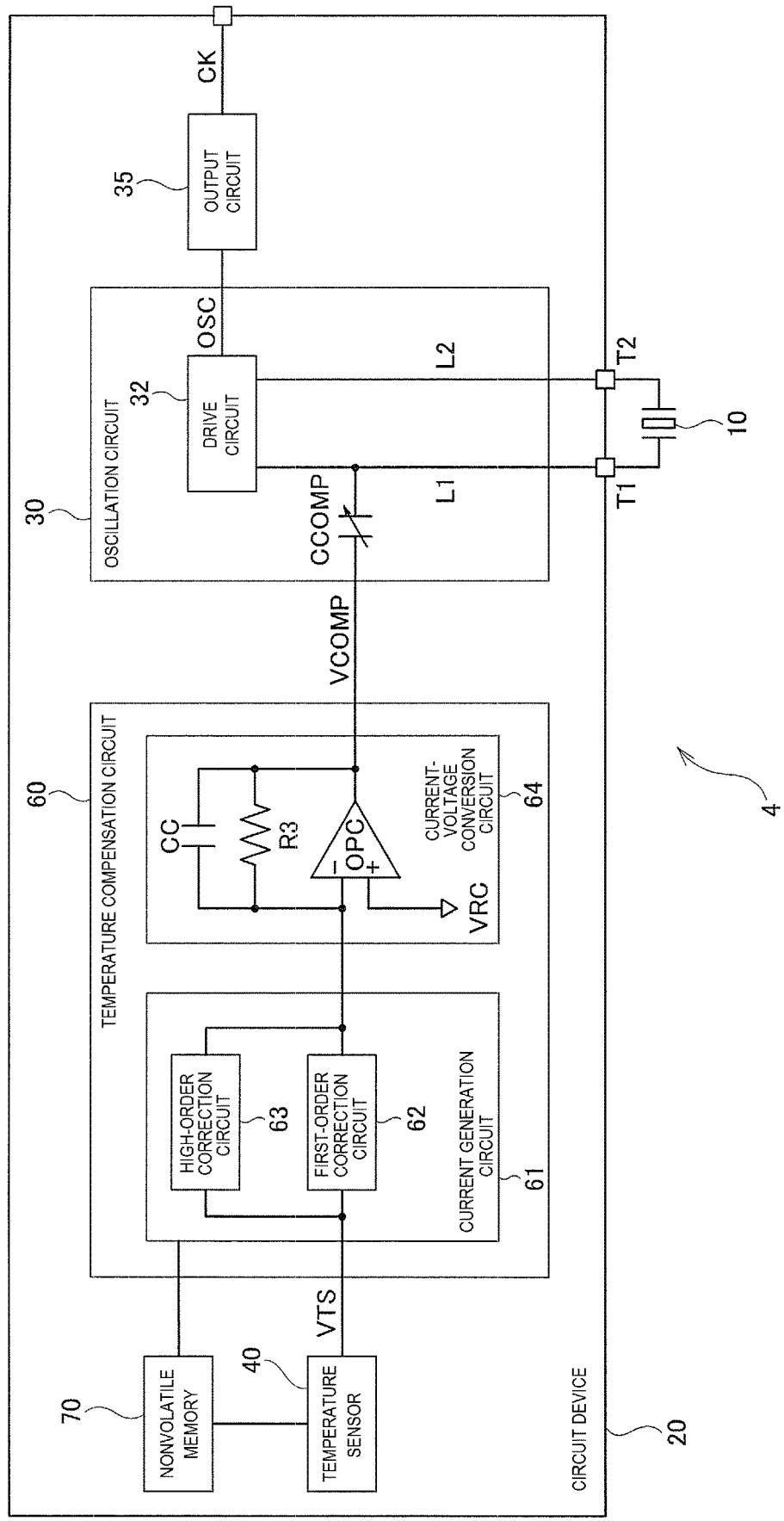
FIG. 2 is a diagram showing a detailed configuration example of a temperature compensation circuit and an oscillation circuit.

2. Temperature Compensation Circuit 2.1 Detailed Configuration Example of Temperature Compensation Circuit FIG. 2 is a detailed configuration example of the temperature compensation circuit 60 and the oscillation circuit 30. The oscillation circuit 30 includes a drive circuit 32 and the variable capacitance capacitor CCOMP.

The drive circuit 32 is coupled to the terminal T1 via a node L1, and is coupled to the terminal T2 via a node L2. The drive circuit 32 drives the resonator 10 coupled to the terminals T1, T2 to thereby oscillate the resonator 10. The drive circuit 32 can be realized by a transistor such as a bipolar transistor, and a passive element such as a capacitor or a resistor.

One end of the variable capacitance capacitor CCOMP is coupled to the node L1. Alternatively, one end of the variable capacitance capacitor CCOMP can be coupled to the node L2. The other end of the variable capacitance capacitor CCOMP is coupled to an output node of the temperature compensation circuit 60. The variable capacitance capacitor CCOMP is, for example, a MOS capacitor. One end of the MOS capacitor is the gate of a MOS transistor, and the other end of the MOS capacitor is the source and the drain of the MOS transistor.

The temperature compensation circuit 60 includes a current generation circuit 61 and a current-voltage conversion circuit 64. The current generation circuit 61 includes a first-order correction circuit 62 and a high-order correction circuit 63. It should be noted that in the present embodiment, a "function" is a function having the temperature as a variable.

The first-order correction circuit 62 outputs a primary current approximating a linear function based on the temperature detection voltage VTS. The first-order correction circuit 62 includes, for example, an operational amplifier, a first variable resistive circuit, a second variable resistive circuit, and the third variable resistive circuit. The operational amplifier, the first variable resistive circuit, and the second variable resistive circuit constitute a non-inverting amplifier circuit. The non-inverting amplifier circuit amplifies the temperature detection voltage VTS based on a reference voltage VRC. The non-inverting amplifier circuit outputs the primary current to an input node of the current-voltage conversion circuit 64 via the third variable resistive circuit.

The high-order correction circuit 63 outputs a tertiary current approximating a cubic function to the input node of the current-voltage conversion circuit 64 based on the temperature detection voltage VTS. The high-order correction circuit 63 includes, for example, a first differential circuit for performing a differential operation based on the temperature detection voltage VTS, and a second differential circuit for outputting the tertiary current by performing a differential operation based on an output voltage of the first differential circuit and the temperature detection voltage VTS.

The current-voltage conversion circuit 64 adds the primary current and the tertiary current to each other, and then performs current-voltage conversion on the current as the result of the addition to thereby output the temperature compensation voltage VCOMP. Thus, the temperature compensation voltage VCOMP approximating the polynomial function can be obtained. The temperature compensation voltage VCOMP is input to the other end of the variable capacitance capacitor CCOMP. By the temperature compensation voltage VCOMP controlling the capacitance value of the variable capacitance capacitor CCOMP, the temperature compensation of the oscillation frequency of the oscillation circuit 30 is achieved. The current-voltage conversion circuit 64 includes an operational amplifier OPC, a resistor R3, and a capacitor CC. The resistor R3 and the capacitor CC are coupled in parallel to each other between an output node and an inverting input node of the operational amplifier OPC. To the non-inverting input node of the operational amplifier OPC, there is input the reference voltage VRC. The output node of the operational amplifier OPC is coupled to the output node of the temperature compensation circuit 60.

It should be noted that the high-order correction circuit 63 can further include a correction circuit for performing forth or higher-order correction. For example, it is possible for the high-order correction circuit to further include a fourth-order correction circuit for outputting a quartic current for approximating a quartic function, and a fifth-order correction circuit for outputting a quintic current for approximating a quintic function.

By using the temperature compensation circuit 60 including the current generation circuit 61 and the current-voltage conversion circuit 64 as described above, it becomes possible to output the appropriate temperature compensation voltage VCOMP. When the temperature compensation circuit 60 is included in the oscillator 4, it becomes possible to suppress the frequency fluctuation of the clock CK due to the temperature change to thereby output the clock signal CK high in accuracy.

Figure 12:
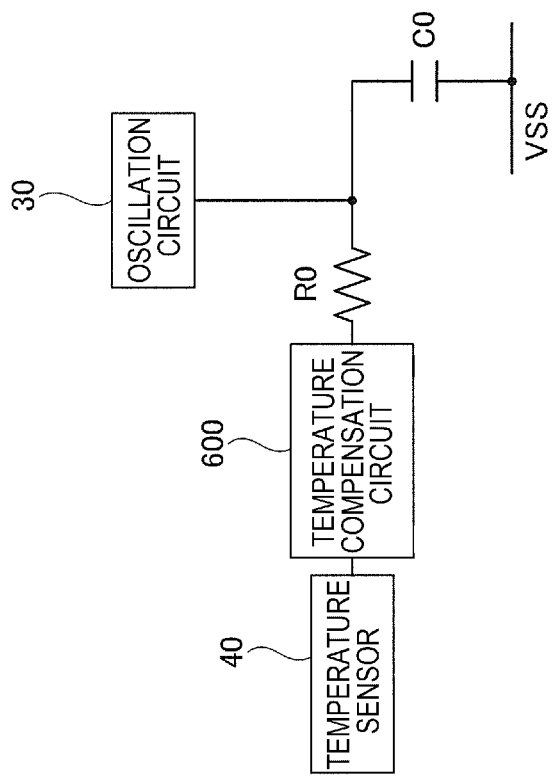
FIG. 12 is a diagram for explaining a comparative example of the circuit device.

FIG. 12 is a diagram for explaining a comparative example of the circuit device. It should be noted that substantially the same constituents as in the present embodiment are denoted by the same reference symbols as in FIG. 2. In the comparative example, an RC low-pass filter is constituted by a resistor R0 and a capacitor C0. The resistor R0 is disposed between an output node of the temperature compensation circuit 600 and the oscillation circuit 30. Further, the capacitor C0 is disposed between one end of the resistor R0 and a given reference potential. The reference potential here is, for example, a low potential side power supply voltage VSS, and is the ground in a narrow sense. In the comparative example, the RC low-pass filter is disposed outside the temperature compensation circuit 600. By providing the RC low-pass filter, it becomes possible to reduce the noise included in the temperature compensation voltage.

Taking the fact that the temperature compensation voltage is a DC voltage into consideration, it is desirable that the cutoff frequency of the low-pass filter has a somewhat low value. In other words, it is desirable to enlarge the product of the resistance value of the resistor R0 and the capacitance value of the capacitor C0.

It should be noted that when using the configuration shown in FIG. 12, it is necessary to consider the thermal noise occurring in the resistor R0. It is known that the higher the resistance value is, the larger the thermal noise in the resistor R0 becomes. Therefore, in order to prevent the accuracy of the temperature compensation voltage from degrading due to the thermal noise, it is desirable to reduce the resistance value of the resistor R0. Therefore, in order to enhance the noise reduction effect due to the low-pass filter, it is necessary to increase the capacitance value of the capacitor C0. As a result, the capacitor C0 grows in size. For example, the capacitor C0 is a laminated ceramic capacitor discretely disposed outside an IC chip in which the circuit device 20 is disposed. As described above, in the comparative example, since the external components disposed outside the chip grow in size, it is difficult to reduce in size the device including the circuit device 20.

Further, in the configuration shown in FIG. 12, the resistor R0 is coupled to the oscillation circuit 30. There is a possibility that an AC current flows through the resistor R0 due to the oscillation signal generated by the oscillation circuit 30. Therefore, in the configuration shown in FIG. 12, it also becomes necessary to consider a flicker noise occurring in the resistor R0. The larger the area of the resistor R0 is, the smaller the flicker noise becomes. Therefore, in the comparative example, in order to reduce the flicker noise, it is necessary to increase the area of the resistor R0, and the reduction in size of the circuit device 20 is also difficult.

Figure 3:
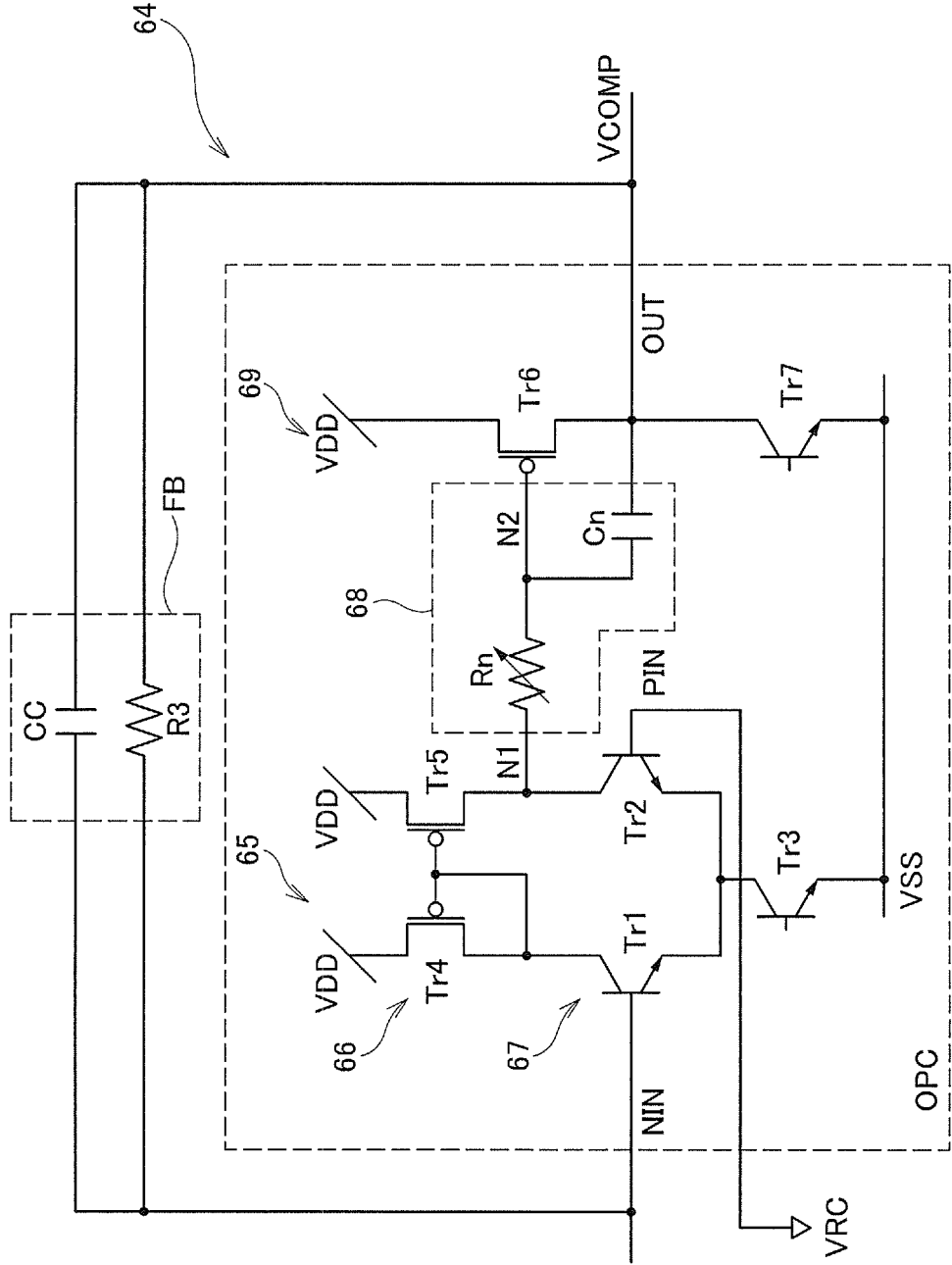
FIG. 3 is a diagram showing a detailed configuration example of a current-voltage conversion circuit.

FIG. 3 is a diagram showing a configuration of the current-voltage conversion circuit 64 in the present embodiment. As described above using FIG. 2, the circuit device 20 includes the current generation circuit 61 and the current-voltage conversion circuit 64. The current generation circuit 61 generates a temperature compensation current based on the temperature detection voltage VTS. The current generation circuit 61 comprises, for example, the first-order correction circuit 62 and the high-order correction circuit 63, but the configuration of the current generation circuit 61 is not limited to this configuration. The current-voltage conversion circuit 64 includes the operational amplifier OPC and a feedback circuit FB. The operational amplifier OPC has a first input node NIN to which the temperature compensation current is input, and an output node OUT for outputting the temperature compensation voltage VCOMP. The feedback circuit FB is disposed between the first input node NIN and the output node OUT of the operational amplifier OPC. The first input node NIN is specifically an inverting input node of the operational amplifier OPC. The feedback circuit FB comprises, for example, a resistor R3 and a capacitor CC disposed in parallel to each other, but the configuration of the feedback circuit FB is not limited to this configuration. The current-voltage conversion circuit 64 performs the current-voltage conversion on the temperature compensation current to thereby output the temperature compensation voltage VCOMP.

Further, the operational amplifier OPC includes a differential section 65, an output section 69, and an RC low-pass filter 68. The RC low-pass filter 68 includes a resistor and a capacitor Cn. Although an example in which the resistor included in the RC low-pass filter 68 is a variable resistive circuit Rn will hereinafter be described, the resistor can also have a fixed resistance value. The differential section 65 has a current mirror circuit 66 and differential pair transistors 67. The current mirror circuit 66 includes a P-type transistor Tr4 and a P-type transistor Try as shown in FIG. 3. The output section 69 outputs the temperature compensation voltage VCOMP. The RC low-pass filter 68 is disposed between an output node N1 of the differential section 65 and an input node N2 of the output section 69. The RC low-pass filter 68 performs a low-pass filter process on an output signal of the differential section 65 to output the result to the input node N2 of the output section 69.

The RC low-pass filter 68 in the present embodiment is disposed between the differential section 65 and the output section 69 of the operational amplifier OPC. Therefore, it becomes possible to reduce the thermal noise due to the feedback of the operational amplifier OPC.

Figure 4:
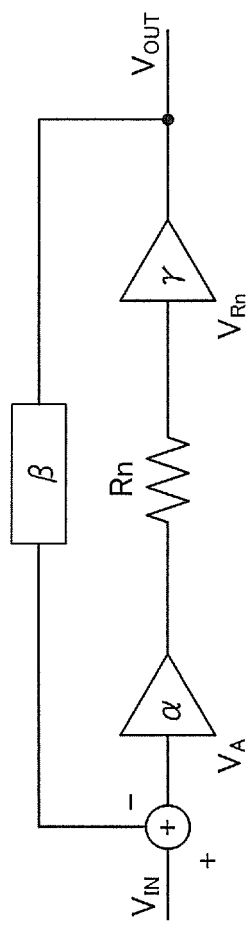
FIG. 4 is a diagram for explaining the fact that the thermal noise is reduced.

FIG. 4 is a diagram for explaining the thermal noise in the variable resistive circuit Rn, and is a diagram schematically showing the configuration of the current-voltage conversion circuit 64. The reference symbols $V_{IN}$ and $V_{OUT}$ in FIG. 4 denote an input voltage and an output voltage of the current-voltage conversion circuit 64. The reference symbol $V_A$ denotes an input voltage of the differential section 65 of the operational amplifier OPC. The reference symbol $V_{Rn}$ denotes the thermal noise voltage occurring in the variable resistive circuit Rn. The reference symbol α denotes a gain in the differential section 65 of the operational amplifier OPC. The reference symbol β denotes a feedback gain. The reference symbol γ denotes a gain in the output section 69 of the operational amplifier OPC. In the example shown in FIG. 4, the voltages $V_{out}$ and $V_A$ can be expressed as the following formulas (1) and (2), respectively, and the following formula (3) is derived from the following formulas (1) and (2).

$$V_{OUT} = \alpha\gamma V_A + \gamma V_{Rn} \quad (1)$$

$$V_A = V_{IN} - \beta \times V_{OUT} \quad (2)$$

$$\frac{V_{OUT}}{V_{IN}} = \frac{\alpha\gamma}{1+\alpha\beta\gamma} + \frac{\gamma}{1+\alpha\beta\gamma} \times \frac{V_{Rn}}{V_{IN}} \quad (3)$$

Since the product αβγ of the three gains is sufficiently higher than 1, the formula (3) described above can be modified as the following formula (4). As is understood from the second term of the right side of the following formula (4), due to the feedback of the operational amplifier OPC, the thermal noise can be reduced to 1/(αβ). Since the gain of the operational amplifier OPC is extremely high, it is possible to sufficiently lower the thermal noise.

$$\frac{V_{OUT}}{V_{IN}} = \frac{1}{\beta} + \frac{1}{\alpha\beta} \times \frac{V_{Rn}}{V_{IN}} \quad (4)$$

Since the thermal noise is reduced, in the present embodiment, it is possible to make the resistance value of the resistor included in the RC low-pass filter 68 higher compared to that in the comparative example. Therefore, it is possible to decrease the capacitance value of the capacitor Cn necessary to realize the desired cutoff frequency. Thus, the capacitor Cn can be incorporated in the chip, and thus, the reduction in size of the circuit device 20 becomes possible.

Further, in the method of the present embodiment, one end of the variable resistive circuit Rn included in the RC low-pass filter 68 is coupled to the input node N2 of the output section 69. The input node N2 of the output section 69 is, for example, the gate of the P-type transistor Tr6, and is therefore in the high-impedance state. In other words, in the method of the present embodiment, since it is conceivable that the current does not flow through the variable resistive circuit Rn, the influence of the flicker noise is suppressed. Therefore, it is not necessary to increase the area of the variable resistive circuit Rn, and thus, the reduction in size of the circuit device 20 is easy.

Figure 5:
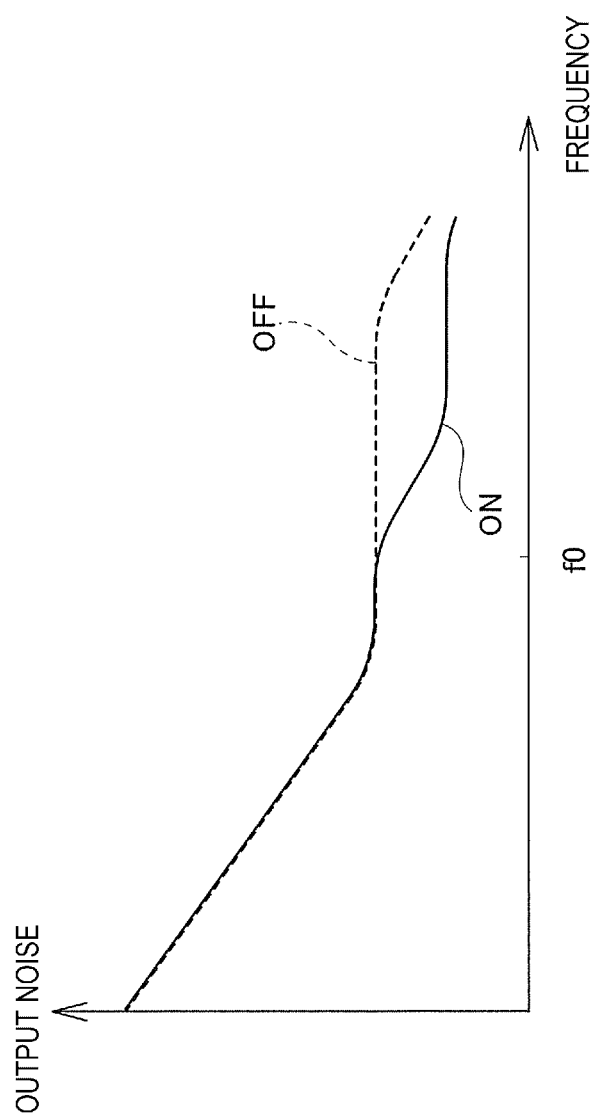
FIG. 5 is a diagram for explaining the frequency characteristic of an output noise.

FIG. 5 is a diagram for explaining advantages of the method of the present embodiment. FIG. 5 is a double logarithmic chart in which the horizontal axis corresponds to the frequency, and the vertical axis corresponds to an output noise of the temperature compensation circuit 60. As shown in FIG. 5, by switching on the function of the RC low-pass filter 68 in the present embodiment, the output noise in a frequency range higher than the given frequency f0 compared to when switching off the function.

It should be noted that the given frequency f0 is a frequency corresponding to the unity gain frequency at which the open-loop gain of the operational amplifier OPC becomes 0 dB. As the frequency characteristic of the temperature compensation circuit 60, it is necessary to consider not only the cutoff frequency of the RC low-pass filter 68, but also the frequency characteristic of the operational amplifier OPC as a whole. It should be noted that by lowering the cutoff frequency of the RC low-pass filter 68 included in the operational amplifier OPC, it is possible to lower the unity gain frequency of the operational amplifier OPC. Therefore, also in the present embodiment, in order to appropriately reduce the noise component, it is important to lower the cutoff frequency of the RC low-pass filter 68.

As shown in FIG. 3, it is also possible for the output section 69 to include the P-type transistor Tr6 and a bipolar transistor Tr7. The P-type transistor Tr6 is disposed between a high potential side power supply voltage VDD and the output node OUT of the operational amplifier OPC, and the input node N2 of the output section 69 is coupled to the gate. The bipolar transistor Tr7 is disposed between the output node OUT of the operational amplifier OPC and the low potential side power supply voltage VSS, and a bias voltage is input to the base.

Further, it is also possible for the differential section 65 to include a first bipolar transistor Tr1 and a second bipolar transistor Tr2 as the differential pair transistors 67. The first input node NIN of the operational amplifier OPC is coupled to the base of the first bipolar transistor Tr1. The second input node PIN to which the reference voltage VRC is input is coupled to the base of the second bipolar transistor Tr2.

Further, it is possible for the differential section 65 to include a third bipolar transistor Tr3 which is disposed between the pair of the first bipolar transistor Tr1 and the second bipolar transistor Tr2 and the low potential side power supply voltage VSS, and in which the bias voltage is input to the base.

As described above, it is also possible to use the bipolar transistor in either one or both of the differential section 65 and the output section 69. The bipolar transistor generates a low noise compared to the MOS transistor. Since the method of achieving the noise reduction using the RC low-pass filter 68 is used in the present embodiment, there is a great advantage derived from the reduction of the noise using the bipolar transistors in each section of the current-voltage conversion circuit 64. It should be noted that the bipolar transistors shown as Tr1 through Tr3, and Tr7 are not the essential constituents, and it is possible to adopt a modified implementation such as replacement of some or all of the bipolar transistors with MOS transistors.

It should be noted that the method of the present embodiment can be applied to the oscillator 4 including the circuit device 20 and the resonator 10 described above. By adopting such a configuration, it is possible to realize the oscillator 4 capable of outputting the clock signal CK high in accuracy.

2.2 Variable Resistive Circuit

Further, as shown in FIG. 3, the RC low-pass filter 68 is disposed between the output node N1 of the differential section 65 and the input node N2 of the output section 69, and has the variable resistive circuit Rn having a variable resistance value and the capacitor Cn one end of which is coupled to the output node N1 of the differential section 65. One end of the variable resistive circuit Rn is coupled to the output node N1 of the differential section 65, and the other end is coupled to the input node N2 of the output section 69. In the present embodiment, one end of the capacitor Cn is coupled to the output node N1 of the differential section 65 via the variable resistive circuit Rn, and the other end is coupled to the output node OUT of the operational amplifier OPC. By using the variable resistive circuit Rn, it becomes possible to flexibly change the filter characteristic. It should be noted that the other end of the capacitor Cn is not necessarily required to be coupled to the output node OUT of the operational amplifier OPC, and can also be coupled to a supply line of the low potential side power supply voltage VSS.

Figure 6:
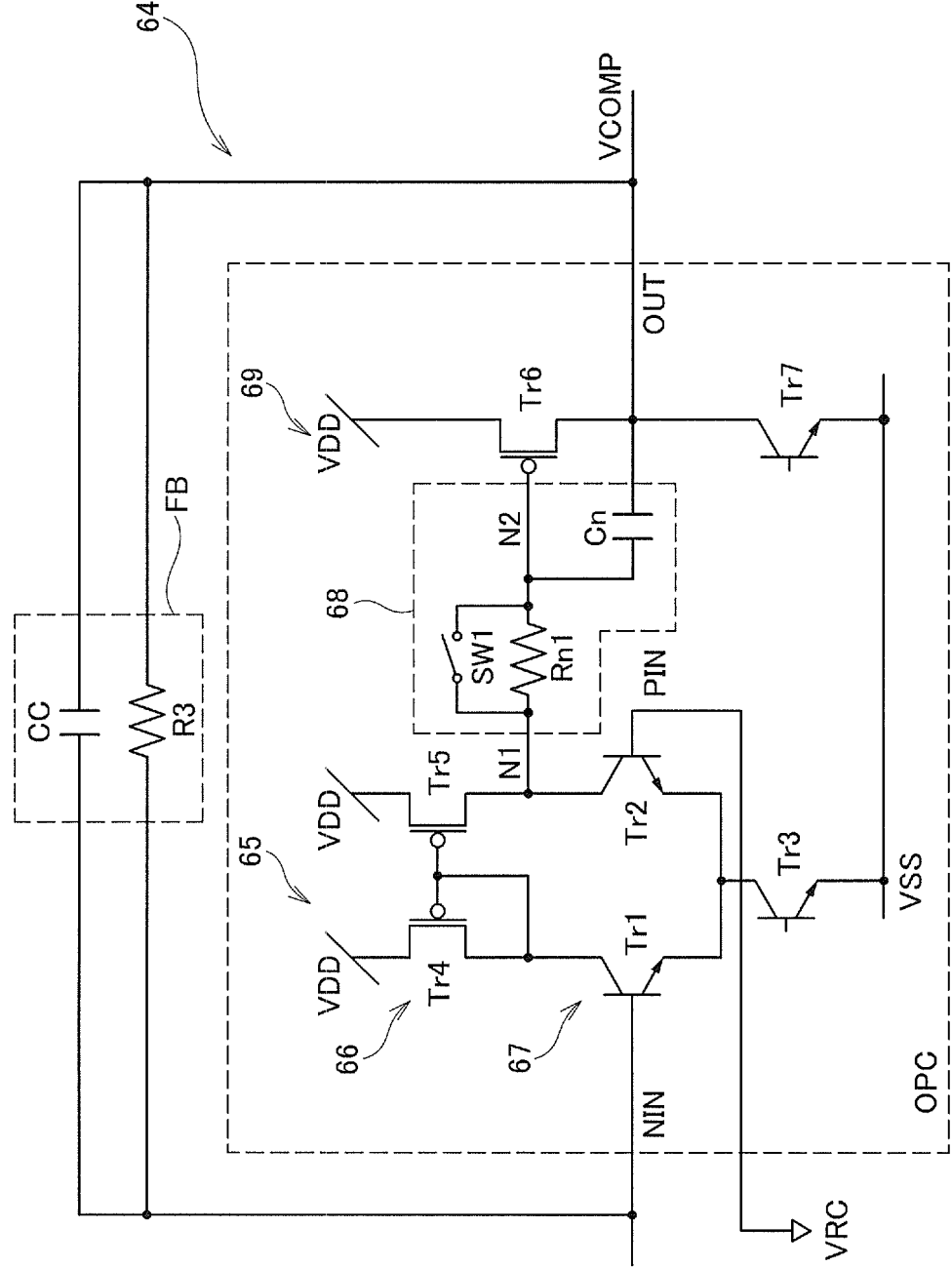
FIG. 6 is a diagram showing a configuration example of a variable resistive circuit.

FIG. 6 is a diagram showing a configuration example of the current-voltage conversion circuit 64 including the variable resistive circuit Rn. As shown in FIG. 6, it is possible for the variable resistive circuit Rn to include a resistor Rn1 and a switch SW1. The resistor Rn1 is disposed between the output node N1 of the differential section 65 and the input node N2 of the output section 69. The switch SW1 is disposed between the output node N1 of the differential section 65 and the input node N2 of the output section 69 in parallel to the resistor Rn1. By using the configuration shown in FIG. 6, the control of switching between the state in which the resistor Rn1 is coupled between the differential section 65 and the output section 69 and the state in which the resistor Rn1 is bypassed becomes possible.

The switch SW1 shown in FIG. 6 changes from ON to OFF after a predetermined wait period elapses. In other words, the resistance value of the variable resistive circuit Rn is 0Ω before the predetermined wait period elapses, and then changes to the resistance value of the resistor Rn1 after the predetermined wait period elapses. In other words, the filter function is switched off before the predetermined wait period elapses, and is switched on after the predetermined wait period elapses.

The predetermined wait period mentioned here can also be a period set at the startup of the circuit device 20. For example, when the circuit device 20 is included in the oscillator 4, the oscillation circuit 30 starts to drive the resonator 10 due to the startup of the circuit device 20. When the oscillation signal OSC based on the resonator 10 stabilizes, the output circuit 35 starts to output the clock signal CK. Thus, since the current flowing through the circuit device 20 rapidly increases, a change in temperature is caused by the output circuit 35 and so on as a heat source. In order to make the temperature compensation voltage VCOMP follow at high speed to the temperature change, it is desirable for the filter function to be switched off. Further, after the follow-up to the temperature change is completed, the filter function is switched on in order to perform the noise reduction. By changing the switch SW1 from ON to OFF based on the predetermined wait period as described above, it becomes possible to appropriately operate the circuit device 20 in the startup period and so on. It should be noted that the detailed control timing will be described later using FIG. 9.

Here, the resistor Rn1 can also be a resistor having a fixed resistance value. In this case, the resistance value of the variable resistive circuit Rn can be switched in two levels. It should be noted that it is also possible for the resistor Rn1 itself to be a variable resistor having a variable resistance value. In this case, the variable resistive circuit Rn is capable of performing not only the control of switching whether to bypass the resistor Rn1, but also the control of changing the resistance value of the resistor Rn1. In other words, it is also possible for the variable resistive circuit Rn to have a configuration capable of switching the resistance value in three or more levels. As the resistor Rn1 in this case, configurations of known variable resistive circuits can widely be applied.

From the viewpoint that the control considering the balance between the degree of the follow-up to the temperature change and the degree of the noise reduction is performed, it is sufficient for the method of the present embodiment to have a configuration in which the filter function of the RC low-pass filter 68 is enhanced with time. In other words, when the resistance value of the variable resistive circuit Rn can be controlled in three or more levels, the resistance value is controlled so as to increase with time.

Further, the variable resistive circuit Rn is not limited to the configuration capable of bypassing the resistor Rn1 with the switch SW1. In other words, it is possible to adopt a variety of modified implementations such as elimination of the switch SW1 in FIG. 6.

2.3 Regulator

Figure 7:
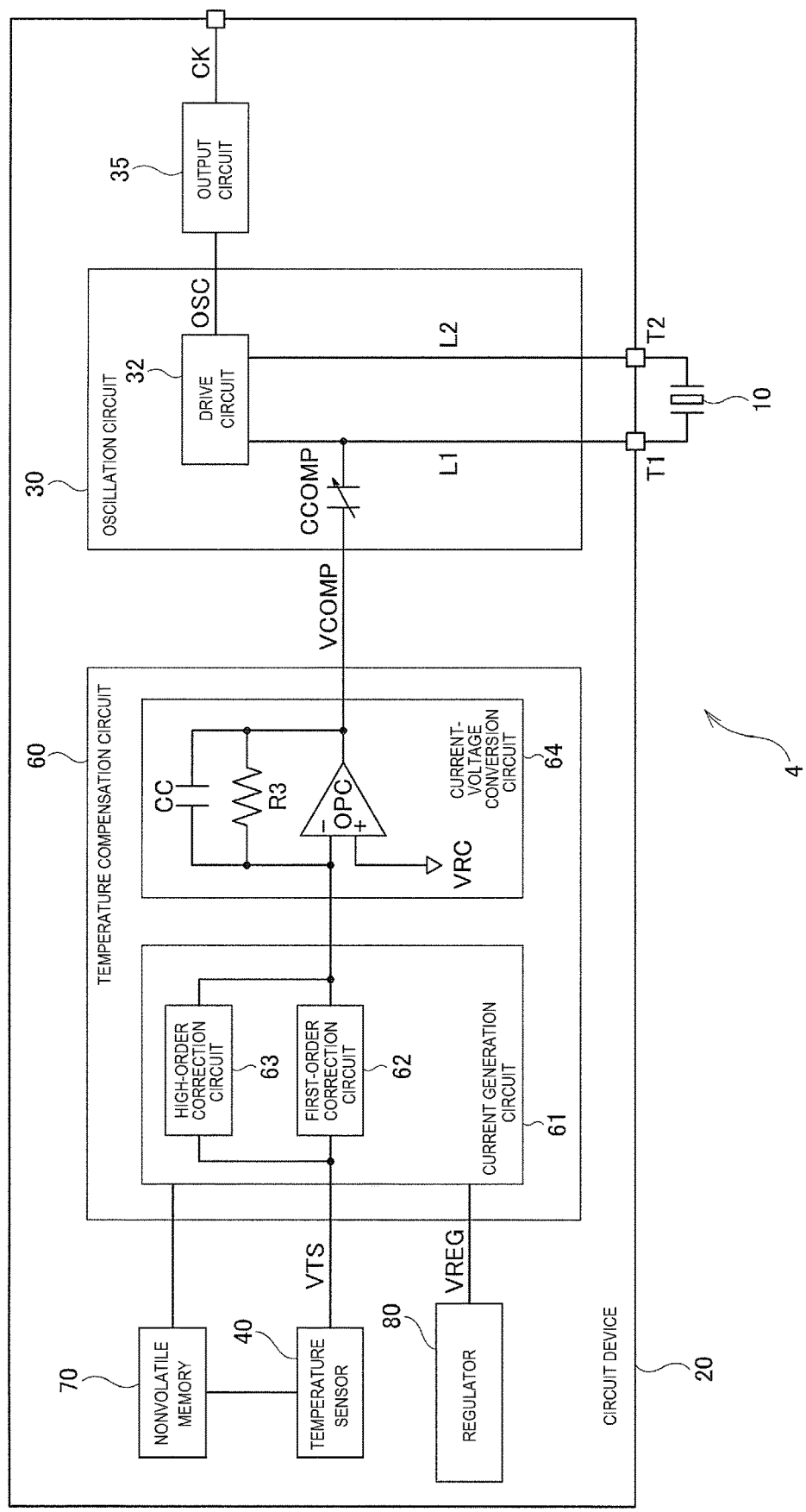
FIG. 7 is a diagram showing a detailed configuration example of a circuit device including a regulator.

FIG. 7 is a diagram showing another configuration example of the circuit device 20. As shown in FIG. 7, it is possible for the circuit device 20 to include a regulator 80 in addition to the configuration shown in FIG. 2. The regulator 80 outputs a regulated voltage VREG based on the high potential side power supply voltage VDD. The regulated voltage VREG is used as the power supply voltage for the current generation circuit 61. Further, it is possible for the regulated voltage VREG to be used as the power supply voltage for other constituents than the circuit device 20 such as the oscillation circuit 30.

Figure 8:
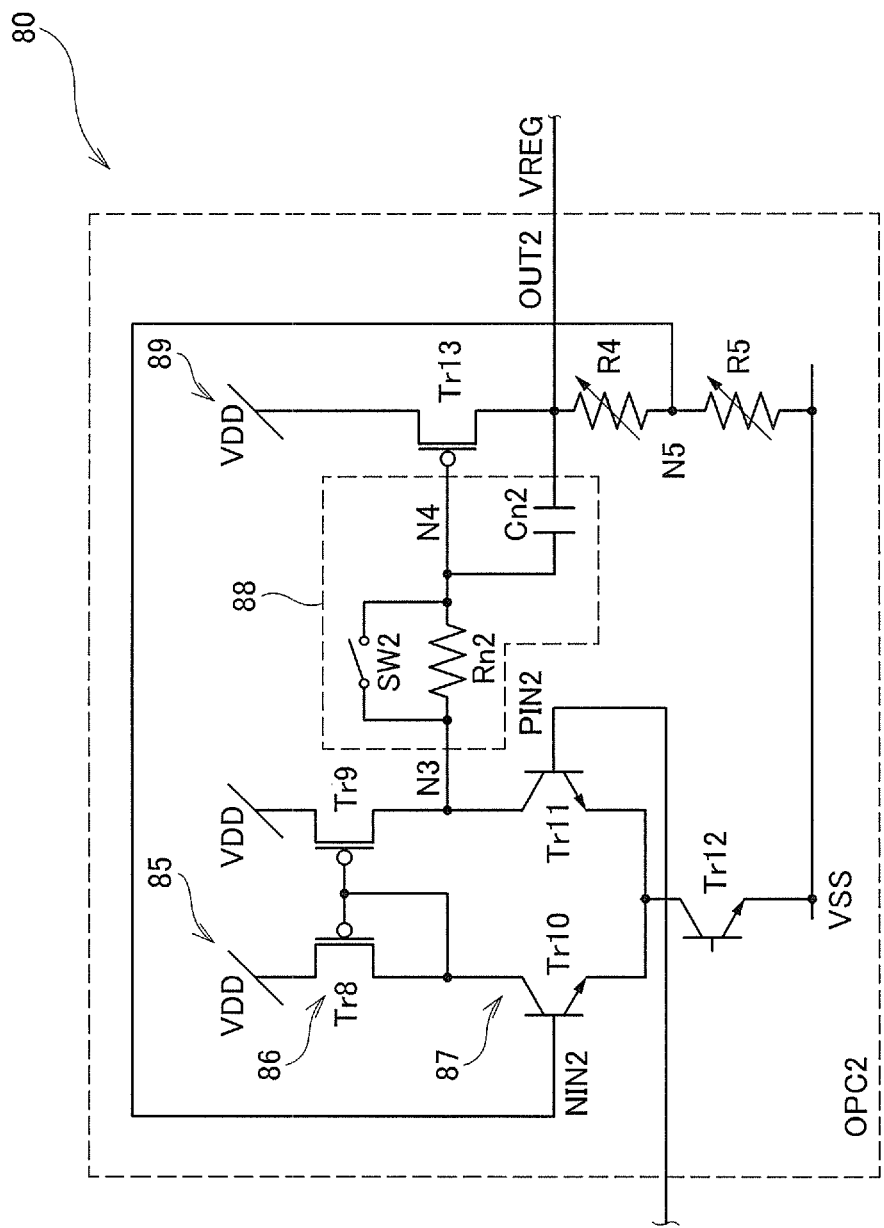
FIG. 8 is a diagram showing a configuration example of the regulator.

The regulator 80 includes a second operational amplifier OPC2 as shown in FIG. 8 described later. In the present embodiment, it is possible to provide substantially the same configuration as the operational amplifier OPC of the current-voltage conversion circuit 64 also to the second operational amplifier OPC2 included in the regulator 80. In other words, the circuit device 20 according to the present embodiment includes the regulator 80 for supplying the current generation circuit 61 with the regulated voltage VREG, and the regulator 80 has a second RC low-pass filter 88.

FIG. 8 is a diagram showing a configuration of the second operational amplifier OPC2 included in the regulator 80. The second operational amplifier OPC2 includes a second differential section 85, a second output section 89, and the second low-pass filter 88. The second differential section has a second current mirror circuit 86 and second differential pair transistors 87. The second current mirror circuit 86 includes a P-type transistor Tr8 and a P-type transistor Tr9. The second output section 89 outputs the regulated voltage VREG. The second RC low-pass filter 88 is disposed between an output node N3 of the second differential section 85 and an input node N4 of the second output section 89. The second RC low-pass filter 88 outputs a signal obtained by performing a low-pass filter process on an output signal of the second differential section 85 to the input node N4 of the second output section 89.

According to this configuration, also in the second operational amplifier OPC2 of the regulator 80, it becomes possible to reduce the circuit device 20 in size while reducing the noise component by disposing the second RC low-pass filter 88 between the second differential section 85 and the second output section 89. The second RC low-pass filter 88 has substantially the same configuration as, for example, the RC low-pass filter 68 shown in FIG. 6, and includes a resistor Rn2, a switch SW2, and a capacitor Cn2. It should be noted that regarding the configuration of the second RC low-pass filter 88, there can be adopted a variety of modified implementations similarly to the RC low-pass filter 68.

It should be noted that in FIG. 8, the second differential pair transistors 87 include a fourth bipolar transistor Tr10 and a fifth bipolar transistor Tr11. Further, a sixth bipolar transistor Tr12 is disposed between the second differential pair transistors 87 and the low potential side power supply voltage VSS. By using the bipolar transistors, it is possible to reduce the noise component. It should be noted that it is possible to adopt a modified implementation such as replacement of each of the bipolar transistors with a MOS transistor similar to the operational amplifier OPC.

Further, in FIG. 8, the second operational amplifier OPC2 includes a P-type transistor Tr13, a variable resistive circuit R4, and a variable resistive circuit R5. The P-type transistor Tr13 is disposed between the high potential side power supply voltage VDD and an output node OUT2 of the second operational amplifier OPC2. The variable resistive circuits R4 and R5 are disposed in series to each other between the output node OUT2 and the low potential side power supply voltage VSS. By coupling a node N5 between the variable resistive circuit R4 and the variable resistive circuit R5 and a first input node NIN2 of the second operational amplifier OPC2 to each other, the feedback is performed. To a second input node PIN2 of the second operational amplifier OPC2, there is input an input signal. It should be noted that the configuration related to the second output section 89 and the feedback is not limited to the configuration shown in FIG. 8, and a variety of modified implementations can be adopted.

2.4 Control Timing

Figure 9:
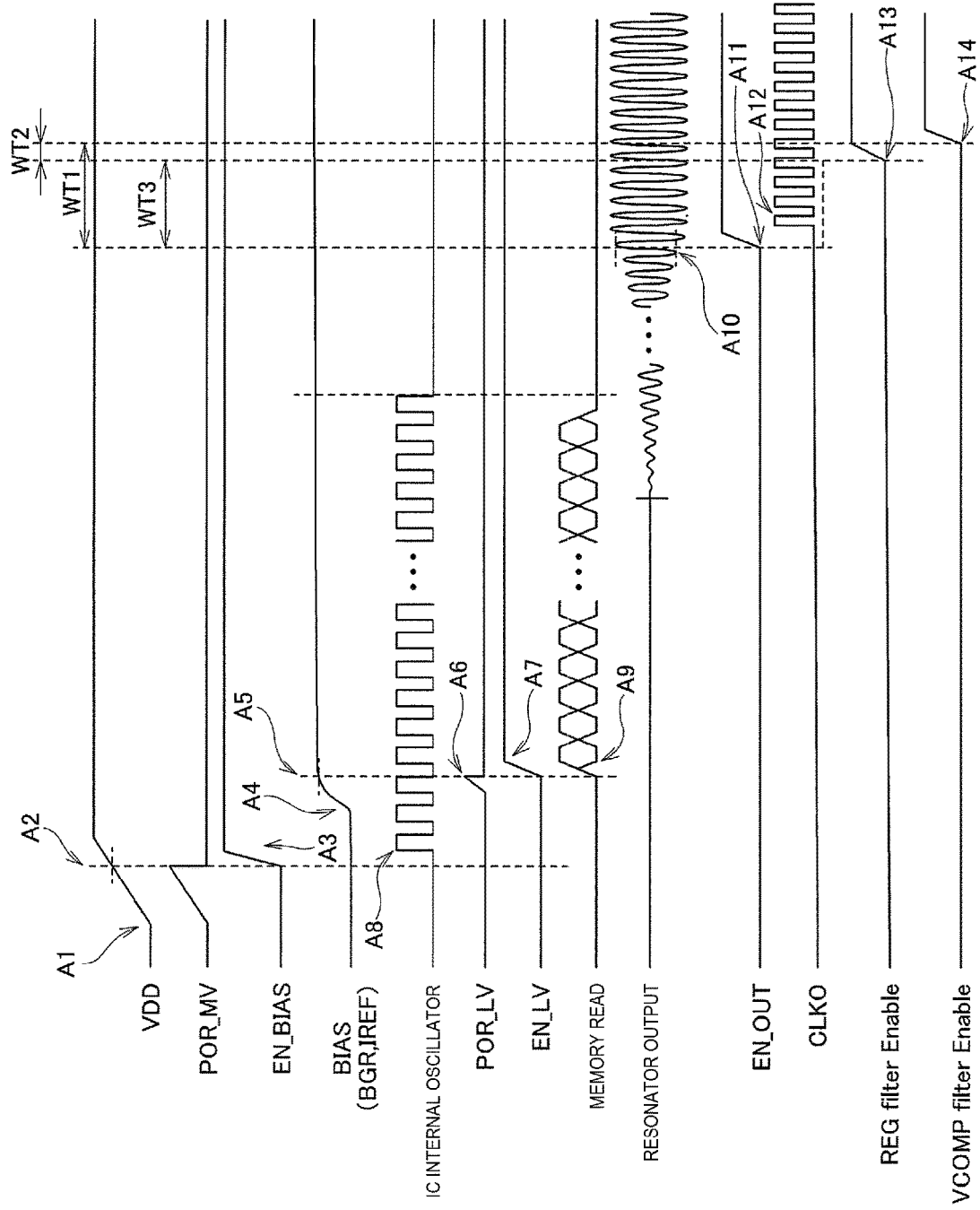
FIG. 9 is a diagram for explaining control timing in the embodiment.

FIG. 9 is a diagram for explaining the control timing in the circuit device 20 according to the present embodiment. It should be noted that the horizontal axis in FIG. 9 represents time. By setting the power on, supply of the high potential side power supply voltage VDD is started (A1). The reference symbol POR_MV denotes a power-on reset signal for circuits which operate using the high potential side power supply voltage VDD as the power supply voltage. At the timing when the high potential side power supply voltage VDD reaches a given voltage value, the power-on reset is performed (A2). The reference symbol EN_BIAS shown in FIG. 9 denotes an enable signal for a bias circuit (BIAS). The bias circuit includes, for example, a bandgap reference circuit and a reference current generation circuit. After performing the power-on reset, the bias circuit is enabled (A3), and the power supply is started (A4).

The reference symbol POR_LV shown in FIG. 9 denotes a power-on reset signal for circuits which operate using the regulated voltage VREG as the power supply voltage, and the reference symbol EN_LV denotes an enable signal for those circuits. After starting the voltage supply indicated by A4, at the timing when the voltage reaches a given voltage value (A5), the power-on reset is performed (A6), and the enable signal for the circuits which operate using the regulated voltage VREG turns to the on state (A7).

Further, since the oscillation of the resonator 10 is not stable at the startup, an internal oscillator of the IC operates (A8), and the reading of controlling data from the nonvolatile memory 70 is performed (A9) based on a clock signal output by the internal oscillator.

The reference symbol EN_OUT shown in FIG. 9 denotes an enable signal for the output circuit 35, and the reference symbol CLKO denotes the clock signal CK output. The amplitude of the oscillation signal OSC as an output of the resonator 10 increases with time. At the timing when the amplitude reaches a given value (A10), the output circuit 35 is enabled (A11). Thus, the output circuit 35 starts to output the clock signal CK (A12).

As described above, by disposing the low-pass filter inside the operational amplifier included in the temperature compensation circuit 60 or the regulator 80, it is possible to reduce the noise component, but the follow-up performance to the variation of the input signal degrades. Specifically, by the RC low-pass filter 68 of the operational amplifier OPC working well, the follow-up performance to the temperature change degrades. When the circuit device 20 includes the oscillation circuit 30 to which the temperature compensation voltage VCOMP is input, and the output circuit 35 for outputting the clock signal CK based on the oscillation signal OSC as the output signal of the oscillation circuit 30, the accuracy of the clock signal CK degrades due to the fact that the temperature compensation voltage VCOMP cannot sufficiently follow the temperature change. Therefore, the switch SW1 included in the operational amplifier OPC of the temperature compensation circuit 60 turns to the off state from the on state after the predetermined wait period elapses from when the output circuit 35 starts to output the clock signal CK. By adopting such a configuration, it becomes possible to appropriately switch between the on state and the off state of the filter function in accordance with the state of the circuit device 20. For example, when the output of the clock signal CK is started, the temperature rises due to an increase in current. By setting the switch SW1 to the on state in the predetermined wait period to bypass the resistor Rn1, it is possible to enhance the follow-up performance to the temperature change.

Further, when the circuit device 20 includes the regulator 80, it is also desirable for the second RC low-pass filter 88 included in the second operational amplifier OPC2 of the regulator 80 to set the filter function to the on state after the output of the resonator 10 stabilizes. This is because when the output of the resonator 10 stabilizes, the current consumption stabilizes. Specifically, the second RC low-pass filter 88 included in the regulator 80 is enabled after a predetermined period elapses from the timing indicated by A10. Enabling the second RC low-pass filter 88 specifically means the control of changing the switch SW2 from the on state to the off state.

As described above, the regulated voltage VREG output by the regulator 80 is used for the operation of the current generation circuit 61. Taking the accuracy of the temperature compensation voltage VCOMP into consideration, it is desirable to firstly enable the operation of the second RC low-pass filter of the regulator 80, and then enable the operation of the RC low-pass filter 68 of the current-voltage conversion circuit 64. On this occasion, it is desirable to enable the RC low-pass filter 68 after the predetermined wait period elapses from when the operation of the second RC low-pass filter 88 has been enabled. Specifically, the switch SW1 of the variable resistive circuit Rn is changed from the on state to the off state after the predetermined wait period elapses from when the operation of the second RC low-pass filter 88 has been enabled. By adopting this configuration, it is possible to suppress the influence of the switching noise.

In the example shown in FIG. 9, the reference symbol REG filter Enable denotes an enable signal for the second RC low-pass filter 88 included in the regulator 80, and the reference symbol VCOMP filter Enable denotes an enable signal for the RC low-pass filter 68 included in the current-voltage conversion circuit 64. The operation of the second RC low-pass filter 88 of the regulator 80 is enabled at the timing indicated by A13, and then, the operation of the RC low-pass filter 68 of the current-voltage conversion circuit 64 is enabled at the timing indicated by A14. As described above, the predetermined wait period in the present embodiment can also be a period WT1 from the rising timing A11 of EN_OUT as the output enable signal for the clock signal CK to the timing A14 when the operation of the RC low-pass filter 68 is enabled. The timing indicated by A11 corresponds to the timing A10 when the output of the resonator 10 stabilizes. Further, the predetermined wait period can also be a period WT2 from the timing A13 when the operation of the second RC low-pass filter 88 of the regulator 80 is enabled to the timing A14 when the operation of the RC low-pass filter 68 is enabled. It should be noted that the period WT1 is a period obtained by combining a period WT3 from the rising timing A11 of EN_OUT to the timing A13 when the operation of the second RC low-pass filter 88 is enabled and the period WT2 from the timing A13 when the operation of the second RC low-pass filter 88 is enabled to the timing A14 when the operation of the RC low-pass filter 68 is enabled with each other. It should be noted that there has been described here the example in which the predetermined wait period is set based on the start timing of the rising edge of each of the enable signals. However, the timing to be referred to can be defined as the timing when the enable signal reaches a given reference voltage value. Alternatively, instead of the timing indicated by A11, the timing A12 when the output of the clock signal CLKO actually starts can be used as the starting point of the periods WT1 and WT3. Besides the above, a variety of modified implementations can be adopted with respect to setting of the predetermined wait period.

3. Electronic Apparatus, Vehicle

Further, the method of the present embodiment can be applied to an electronic apparatus or a vehicle including the circuit device 20 described above and a processing device for performing a process based on the output signal from the circuit device 20.

Figure 10:
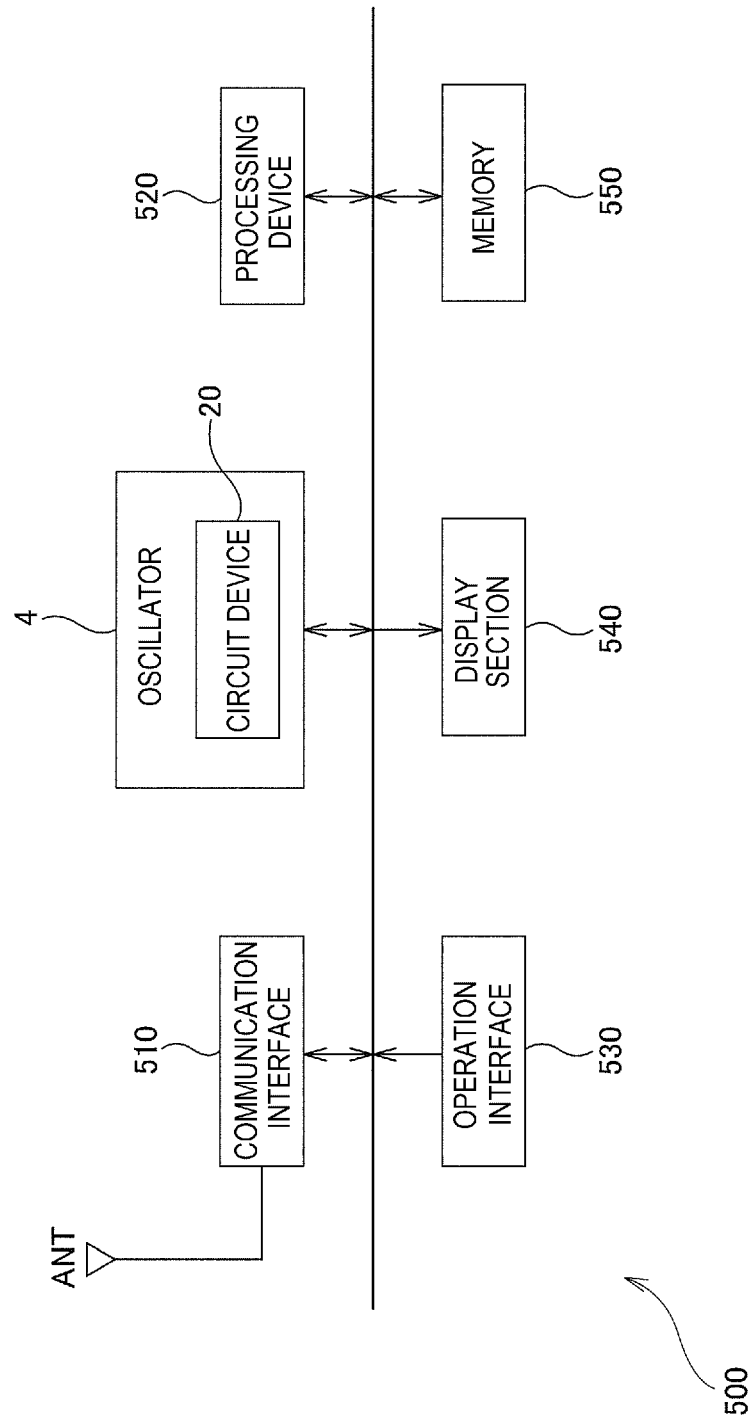
FIG. 10 is a diagram showing a configuration example of an electronic apparatus.

FIG. 10 shows a configuration example of the electronic apparatus 500 including the circuit device 20 according to the present embodiment. The electronic apparatus 500 includes the circuit device 20 according to the present embodiment and a processing device 520 which operates using the clock signal CK based on the oscillation signal OSC of the oscillation circuit 30 of the circuit device 20. Specifically, the electronic apparatus 500 includes the oscillator 4 having the circuit device 20 according to the present embodiment, and the processing device 520 operates based on the clock signal from the oscillator 4. Further, the electronic apparatus 500 can include an antenna ANT, a communication interface 510, an operation interface 530, a display section 540, and a memory 550. It should be noted that the configuration of the electronic apparatus 500 is not limited to the configuration shown in FIG. 10, but it is possible to adopt a variety of modified implementations such as elimination of some of the constituents or addition of other constituents.

The electronic apparatus 500 is, for example, a network-related apparatus such as a base station or a router, a highly accurate measurement instrument for measuring a physical quantity such as a distance, time, flow speed, or a flow rate, a biological information measurement apparatus for measuring biological information, or an in-car apparatus. The biological information measurement apparatus is, for example, an ultrasonic measurement device, a sphygmograph, or a blood-pressure measurement device. The in-car apparatus is an apparatus for automated driving, or the like. Further, the electronic apparatus 500 can also be a wearable apparatus such as a head-mounted display device or a timepiece related apparatus, a robot, a printer, a projection apparatus, a portable information terminal such as a smartphone, a content supply apparatus for delivering contents, or a video apparatus such as a digital camera or a video camera.

Further, as the electronic apparatus 500, there can be cited an apparatus to be used in a next-generation mobile communication system such as 5G. The circuit device 20 according to the present embodiment can be used for a variety of apparatuses such as abase station, a remote radio head (RRH), or a portable communication terminal for the next-generation mobile communication system. In the next-generation mobile communication system, there is demanded a highly accurate clock frequency for time synchronization and so on, and therefore, the next-generation mobile communication system is suitable as an application example of the circuit device 20 according to the present embodiment capable of generating the highly accurate clock signal.

The communication interface 510 performs a process of receiving data from the outside and transmitting data to the outside via the antenna ANT. The processing device 520 as a processor performs a control process for the electronic apparatus 500, a variety of types of digital processing of the data transmitted or received via the communication interface 510, and so on. The function of the processing device 520 can be realized by a processor such as a microcomputer. The operation interface 530 is for a user to perform an input operation, and can be realized by operation buttons, a touch panel display, or the like. The display section 540 is for displaying a variety of types of information, and can be realized by a display using a liquid crystal, an organic EL, or the like. The memory 550 is for storing the data, and the function thereof can be realized by a semiconductor memory such as a RAM or a ROM.

It should be noted that in FIG. 10, there is described when the electronic apparatus 500 includes the oscillator 4 as an example, the configuration of the electronic apparatus 500 is not limited to this example. It is sufficient for the electronic apparatus 500 to include the circuit device 20 for generating the temperature compensation voltage VCOMP based on be temperature detection voltage VTS from the temperature sensor 40, and a processing device which operates based on the temperature compensation voltage VCOMP.

Figure 11:
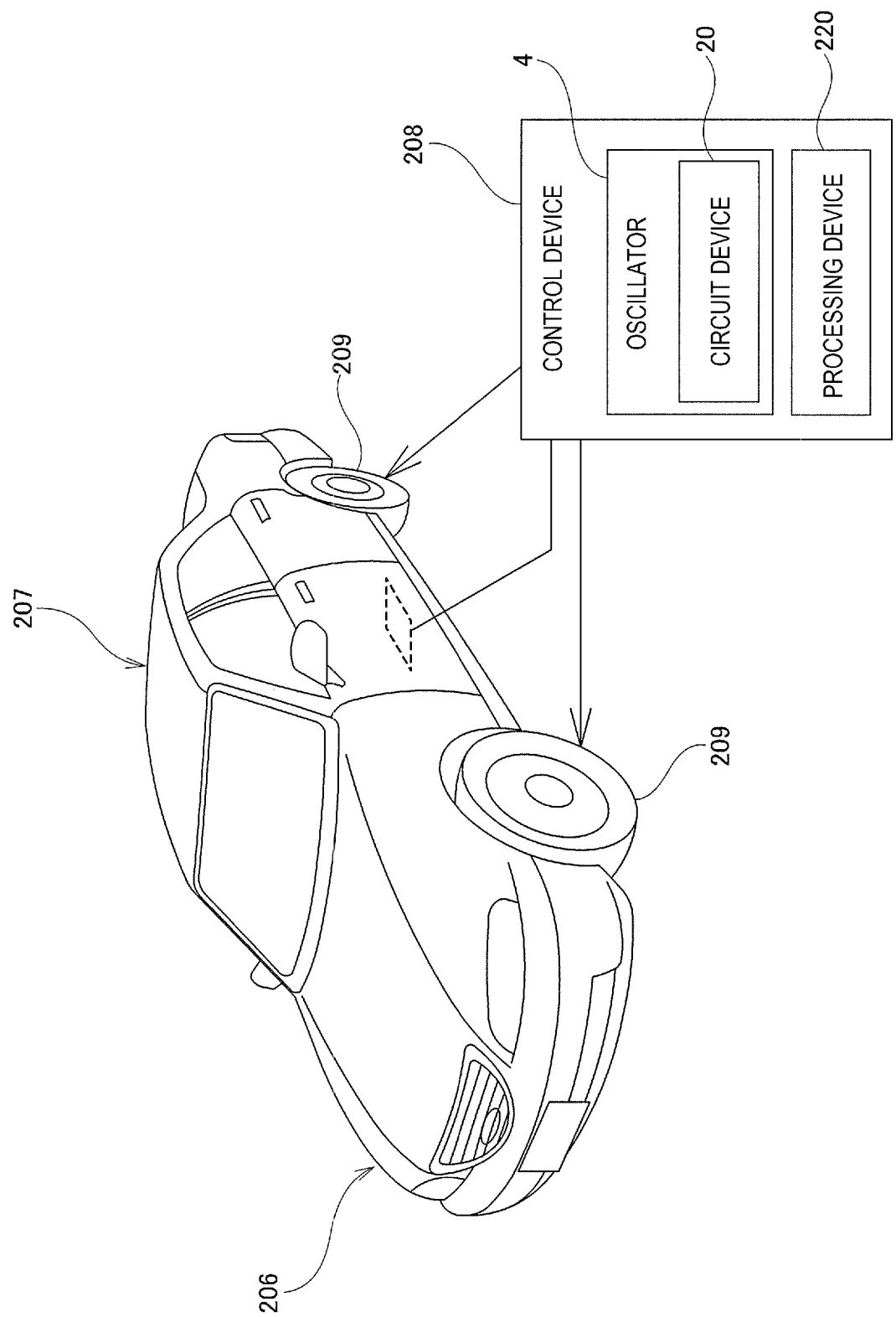
FIG. 11 is a diagram showing a configuration example of a vehicle.

FIG. 11 shows an example of a vehicle including the circuit device 20 according to the present embodiment. The vehicle includes the circuit device 20 according to the present embodiment and a processing device 220 which operates using the clock signal CK based on the oscillation signal OSC of the oscillation circuit 30 of the circuit device 20. Specifically, the vehicle includes the oscillator 4 having the circuit device 20 according to the present embodiment, and the processing device 220 operates based on the clock signal from the oscillator 4. The circuit device 20 according to the present embodiment can be incorporated in a variety of vehicles such as a car, an airplane, a motorbike, a bicycle, a ship, or a boat. The vehicle is equipment or a device which is provided with a drive mechanism such as an engine or an electric motor, a steering mechanism such as a steering wheel or a helm, and a variety of electronic apparatuses, and moves on the ground, in the air, or on the sea. FIG. 11 schematically shows a car 206 as a specific example of the vehicle. The car 206 incorporates the circuit device 20 according to the present embodiment. Specifically, the car 206 as the vehicle includes a control device 208, and the control device 208 includes the oscillator 4 including the circuit device 20 according to the present embodiment, and the processing device 220 which operates based on the clock signal generated by the oscillator 4. The control device 208 controls the stiffness of the suspension in accordance with, for example, the attitude of a car body 207, and controls the brake of each of the wheels 209. For example, it is also possible to realize automated driving of the car 206 using the control device 208. It should be noted that the apparatus incorporating the circuit device 20 according to the present embodiment is not limited to such a control device 208, but the circuit device 20 according to the present embodiment can be incorporated in a variety of types of in-car equipment such as meter panel equipment or navigation equipment provided to a vehicle such as the car 206.

It should be noted that in FIG. 11, there is described when the vehicle includes the oscillator 4 as an example, the configuration of the vehicle is not limited to this example. It is sufficient for the vehicle to include the circuit device 20 for generating the temperature compensation voltage VCOMP based on the temperature detection voltage VTS from the temperature sensor 40, and a processing device which operates based on the temperature compensation voltage VCOMP.

As described hereinabove, the circuit device 20 according to the present embodiment includes a current generation circuit and a current-voltage conversion circuit. The current generation circuit generates a temperature compensation current based on a temperature detection voltage. The current-voltage conversion circuit includes an operational amplifier having a first input node to which the temperature compensation current is input, and an output node configured to output a temperature compensation voltage, and a feedback circuit disposed between the first input node and the output node of the operational amplifier, and performs current-voltage conversion on the temperature compensation current to output the temperature compensation voltage. The operational amplifier includes a differential section having a current mirror circuit and differential pair transistors, an output section configured to output the temperature compensation voltage, and an RC low-pass filter configured to output a signal obtained by performing a low-pass filter process on an output signal of the differential section to an input node of the output section.

According to the present embodiment, since the RC low-pass filter is disposed inside the operational amplifier, thermal noise of a resistor can be reduced by the feedback. Since a resistance value can be increased, reduction in size of the capacitor of the RC low-pass filter becomes possible. Further, since no current flows through the resistor, the influence of flicker noise can be suppressed. Therefore, the area of the resistor can be reduced.

Further, in the present embodiment, the RC low-pass filter may include a variable resistive circuit which is disposed between an output node of the differential section and the input node of the output section, and a resistance value of which is variable, and a capacitor one end of which is coupled to the output node of the differential section.

By adopting such a configuration, it becomes possible to appropriately dispose the RC low-pass filter between the differential section and the output section, and to use the variable resistive circuit as the resistor of the RC low-pass filter. By using the variable resistive circuit, it is possible to flexibly adjust the frequency characteristic of the circuit device.

Further, in the present embodiment, the variable resistive circuit may include a resistor disposed between the output node of the differential section and the input node of the output section, and a switch disposed in parallel to the resistor between the output node of the differential section and the input node of the output section.

According to such a configuration, by controlling the on state and the off state of the switch, it becomes possible to control the resistance value of the variable resistive circuit.

Further, in the present embodiment, the circuit device may include a regulator having a second RC low-pass filter to supply the current generation circuit with a regulated voltage. The switch included in the operational amplifier of the current-voltage conversion circuit may change from an on state to an off state after a predetermined wait period elapses from when an operation of the second RC low-pass filter is enabled.

By adopting such a configuration, it becomes possible to set the filter function of the RC low-pass filter to the on state after the regulated voltage as the output of the regulator stabilizes.

Further, in the present embodiment, the regulator may include a second operational amplifier. The second operational amplifier includes a second differential section having a second current mirror circuit and second differential pair transistors, a second output section configured to output the regulated voltage, and the second RC low-pass filter. The second RC low-pass filter outputs a signal obtained by performing a low-pass filter process on an output signal of the second differential section to an input node of the second output section.

By adopting such a configuration, it becomes possible to achieve both of the reduction in size and the noise reduction with respect to the operational amplifier included in the regulator.

Further, in the present embodiment, the output section may include a P-type transistor which is disposed between a high potential side power supply voltage and the output node of the operational amplifier, and in which the input node of the output section is coupled to a gate, and a bipolar transistor which is disposed between the output node of the operational amplifier and a low potential side power supply voltage, and in which a bias voltage is input to a base.

By using the bipolar transistor in the output section as described above, it becomes possible to reduce the noise.

Further, in the present embodiment, the differential section may include, as the differential pair transistors, a first bipolar transistor in which the first input node is coupled to a base, and a second bipolar transistor in which a second input node to which a reference voltage is input is coupled to a base.

By using the bipolar transistors in the differential section as described above, it becomes possible to reduce the noise.

Further, in the present embodiment, the differential section may include a third bipolar transistor which is disposed between a set of the first bipolar transistor and the second bipolar transistor and a low potential side power supply voltage, and in which the bias voltage is input to a base.

By using the bipolar transistors in the differential section as described above, it becomes possible to reduce the noise.

Further, in the present embodiment, the circuit device may include an oscillation circuit configured to oscillate a resonator, and an output circuit configured to output a clock signal based on an output signal of the oscillation circuit. The temperature compensation voltage from the current-voltage conversion circuit is input to the oscillation circuit. The switch included in the operational amplifier of the current-voltage conversion circuit turns to the off state from the on state after a predetermined wait period elapses from when the output circuit starts to output the clock signal.

By adopting such a configuration, it becomes possible to enhance the follow-up performance to the temperature change due to the start of the output of the clock signal, and to achieve the noise reduction by setting the filter function to the on state after the temperature stabilizes.

Further, an oscillator according to the present embodiment includes the circuit device described above and a resonator.

Further, an electronic apparatus according to the present embodiment includes any one of the circuit devices described above, and a processing device which operates based on the output signal from the circuit device.

Further, a vehicle according to the present embodiment includes any one of the circuit devices described above, and a processing device which operates based on the output signal from the circuit device.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device, the oscillator, the electronic apparatus, and the vehicle are not limited to those explained in the present embodiment, but can be implemented with a variety of modifications.

What is claimed is:

1. A circuit device comprising:
   a current generation circuit configured to generate a temperature compensation current based on a temperature detection voltage; and
   a current-voltage conversion circuit configured to perform current-voltage conversion on the temperature compensation current to output a temperature compensation voltage, wherein
   the current-voltage conversion circuit includes
      an operational amplifier having a first input node to which the temperature compensation current is input, and an output node configured to output the temperature compensation voltage, and
      a feedback circuit disposed between the first input node and the output node of the operational amplifier, and
   the operational amplifier includes
      a differential section having a current mirror circuit and differential pair transistors,
      an output section configured to output the temperature compensation voltage, and
      an RC low-pass filter configured to output a signal obtained by performing a low-pass filter process on an output signal of the differential section to an input node of the output section.

2. The circuit device according to claim 1, wherein the RC low-pass filter includes
   a variable resistive circuit which is disposed between an output node of the differential section and the input node of the output section, and a resistance value of which is variable, and
   a capacitor one end of which is coupled to the output node of the differential section.

3. The circuit device according to claim 2, wherein the variable resistive circuit includes
   a resistor disposed between the output node of the differential section and the input node of the output section, and
   a switch disposed in parallel to the resistor between the output node of the differential section and the input node of the output section.

4. The circuit device according to claim 3 further comprising:
   a regulator having a second RC low-pass filter to supply the current generation circuit with a regulated voltage, wherein
   the switch changes from an on state to an off state after a predetermined wait period elapses from when an operation of the second RC low-pass filter is enabled.

5. The circuit device according to claim 4, wherein the regulator includes a second operational amplifier, the second operational amplifier includes
   a second differential section having a second current mirror circuit and second differential pair transistors,
   a second output section configured to output the regulated voltage, and
   the second RC low-pass filter, and
   the second RC low-pass filter outputs a signal obtained by performing a low-pass filter process on an output signal of the second differential section to an input node of the second output section.

6. The circuit device according to claim 1, wherein the output section includes
   a P-type transistor which is disposed between a high potential side power supply voltage and the output node of the operational amplifier, and in which the input node of the output section is coupled to a gate, and
   a bipolar transistor which is disposed between the output node of the operational amplifier and a low potential side power supply voltage, and in which a bias voltage is input to a base.

7. The circuit device according to claim 1, wherein the differential section includes, as the differential pair transistors, a first bipolar transistor in which the first input node is coupled to a base, and a second bipolar transistor in which a second input node to which a reference voltage is input is coupled to a base.

8. The circuit device according to claim 7, wherein the differential section includes a third bipolar transistor which is disposed between a set of the first bipolar transistor and the second bipolar transistor and a low potential side power supply voltage, and in which the bias voltage is input to a base.

9. The circuit device according to claim 3 further comprising:
   an oscillation circuit configured to oscillate a resonator; and
   an output circuit configured to output a clock signal based on an output signal of the oscillation circuit, wherein
   the temperature compensation voltage from the current-voltage conversion circuit is input to the oscillation circuit, and
   the switch changes from an on state to an off state after a predetermined wait period elapses from when the output circuit starts to output the clock signal.

10. An oscillator comprising:
    the circuit device according to claim 9; and
    the resonator.

11. An electronic apparatus comprising:
    the circuit device according to claim 1; and
    a processing device which operates based on an output signal from the circuit device.

12. A vehicle comprising:
    the circuit device according to claim 1; and
    a processing device which operates based on an output signal from the circuit device.

* * * * *